United States Patent [19]

Ogawa

[11] Patent Number: 4,476,375
[45] Date of Patent: Oct. 9, 1984

[54] PROCESS FOR SELECTIVE CUTTING OF ELECTRICAL CONDUCTIVE LAYER BY IRRADIATION OF ENERGY BEAM

[75] Inventor: Tsutomu Ogawa, Tokyo, Japan

[73] Assignee: Fujitsu Limited, Kawasaki, Japan

[21] Appl. No.: 478,721

[22] Filed: Mar. 25, 1983

[30] Foreign Application Priority Data

Mar. 30, 1982 [JP] Japan ................................. 57-52100

[51] Int. Cl.$^3$ ............................................ B23K 27/00
[52] U.S. Cl. ........................ 219/121 LN; 219/121 LG
[58] Field of Search .................. 219/121 LE, 121 LF, 219/121 LH, 121 LJ, 121 LN, 121 LG, 121 L, 121 LM; 156/643, 651

[56] References Cited

U.S. PATENT DOCUMENTS 4,272,775   6/1981   Compton et al. ........ 219/121 LH X

Primary Examiner—C. L. Albritton
Attorney, Agent, or Firm—Staas & Halsey

[57] ABSTRACT

A method for cutting an electrical conductive layer having a heat-absorbing film deposited thereon, by irradiating an energy beam on a portion of the electrical conductive layer intended to be cut. The energy beam is irradiated on the film, whereby the portion of the electrical conductive layer melts and alloys with the heat-absorbing film due to the energy absorbed and transferred by the heat-absorbing film.

9 Claims, 9 Drawing Figures

PROCESS FOR SELECTIVE CUTTING OF ELECTRICAL CONDUCTIVE LAYER BY IRRADIATION OF ENERGY BEAM

BACKGROUND OF THE INVENTION

The present invention relates to a process for selectively cutting an electrical conductive layer by irradiation with an energy beam.

Increasing the integration of elements in a semiconductor device, such as a dynamic random access memory, has made it desirable not to have to scrap an entire semiconductor chip just because of a failure of one element in the chip. Toward this end, "redundant" circuits have been developed. To salvage a chip found to have a faulty element in one cell, the redundant circuit is activated and the circuit which leads to the faulty cell is cut. Selective cutting of electrical conductive layers has been developed to meet this requirement in the production of random access memories (RAM's), read only memories (ROM's), and other devices.

It is well known in the art to selectively cut conductive layers by partial removal of the metallic layer with an etchant or by melting the metallic layer with an excess current. Recently, selective cutting by laser beams has come to attention in the art. Accurate, selective cutting of a layer can be realized, since scanning with a laser beam can be controlled accurately.

However, the smallest diameter that a laser beam can be practically made is about 3 $\mu$m. On the other hand, in an integrated circuit with a high packing density, the width of aluminum wirings and the space between them may be no more than 1 $\mu$m. Thus, the irradiated spot covers adjacent wirings.

SUMMARY OF THE INVENTION

A primary object of the present invention is to enable accurate cutting of minute sections of electrical conductive layers.

Another object of the present invention is to enable accurate cutting of minute sections of electrical conductive layers without damaging regions adjacent to the cut portion.

Other objects and advantages of the present invention will be apparent from the following description.

There is provided, according to the present invention, a process for selective cutting of an electrical conductive layer by irradiation with an energy beam. The process includes the steps of depositing a film of a heat-absorbing material on a portion of the electrical conductive layer to be cut and then irradiating the film with the energy beam, whereby that portion of the electrical conductive layer is melted alloyed with the heat absorbing material by the energy that is absorbed and transferred by the heat-absorbing film.

It is advantageous that the energy beam is a laser beam. It is convenient that the electrical conductive layer is aluminum and the heat-absorbing film is amorphous silicon. It is useful that the electrical conductive layer is a refractory metal and the heat-absorbing film is polysilicon or amorphous silicon.

DESCRIPTION OF THE PREFERRED EMBODIMENTS

Figure 1A:
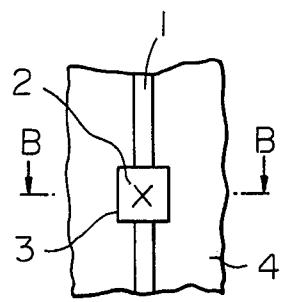
FIG. 1A is a plan view of an electrical conductive layer, a portion of which is coated with a heat-absorbing material, according to the present invention.
Figure 1B:
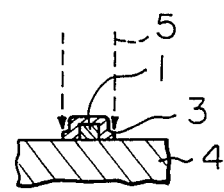
FIG. 1B is a sectional view of the layer taken along line B—B of FIG. 1A.

FIGS. 1A and 1B illustrate the general principle of the invention. A linear aluminum layer 1 is provided on a silicon substrate 4. A portion 2 to be cut is coated with an amorphous silicon layer 3 (FIG. 1A). The reflectivity of aluminum and silicon is 0.92 and 0.41, respectively, at a wave length of 0.5 $\mu$m.

Figure 2:
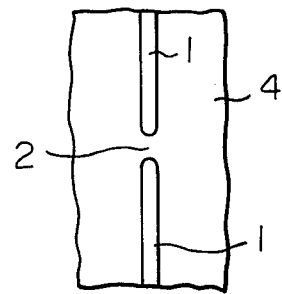
FIG. 2 is a plan view of an electrical conductive layer which is already cut.

The amorphous silicon layer 3 is irradiated by a laser beam 5 (FIG. 1B). The laser beam melts the silicon layer 3 and just the portion of the aluminum layer 1 under the silicon layer 3, while leaving the other portions intact. Surface tension then causes the molten aluminum to separate, completing the cut (FIG. 2). During this process, the silicon becomes alloyed with the molten aluminum.

Figure 3A:
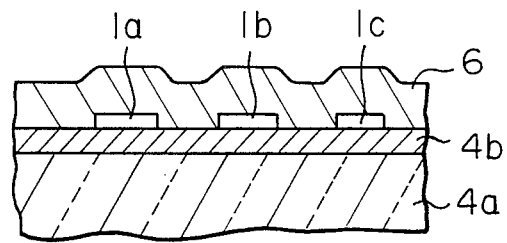
FIGS. 3A to 3D are detailed sectional views of electrical conductive layers for illustrating the steps for selective cutting of the layers according to an embodiment the present invention.

An embodiment of the present invention will now be described in detail referring to FIGS. 3A to 3D and FIGS. 4A and 4B. Three linear aluminum layers 1a to 1c having 1 $\mu$m width and spaced 1 $\mu$m from each other are deposited at a thickness of 1 $\mu$m on a silicon dioxide film 4b formed on the silicon substrate 4a. A protective phosphorus silicate glass (PSG) film 6 is formed by chemical vapour deposition (FIG. 3A).

Figure 3B:
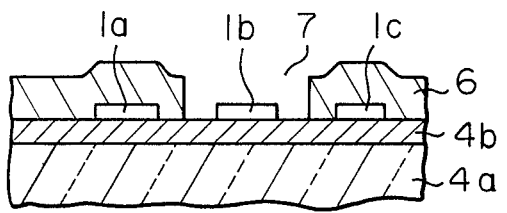
Figure 3C:
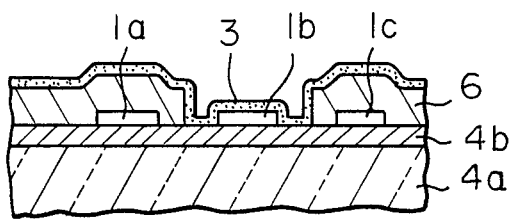
Figure 3D:
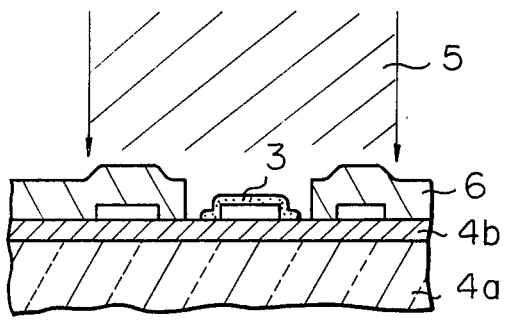
Figure 4A:
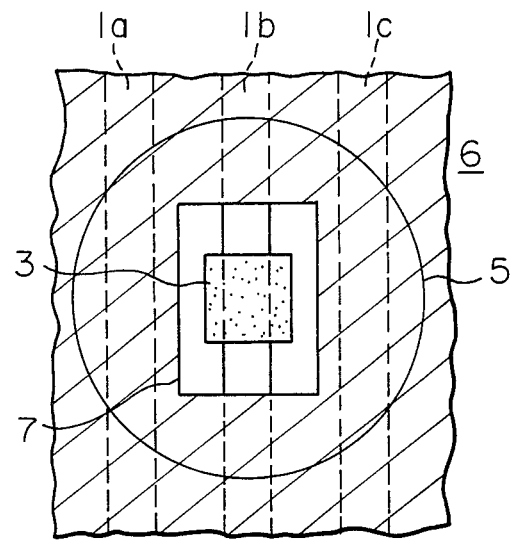
FIG. 4A is a plan view of the electrical conductive layers of FIG. 3D.

A window 7 is opened in the PSG film 6 by etching it with a mixture of hydrogen fluoride and ammonium fluoride solutions. Thus, a portion of aluminum layer 1b to be cut is exposed (FIG. 3B). An amorphous silicon layer 3 is deposited at a thickness of 0.01 to 0.1 $\mu$m (FIG. 3C). The layer 3 is then removed, except for the region of aluminum layer 1b to be cut, by plasma etching using tetrafluorocarbon (FIG. 3D). A continuous wave argon laser beam 5 with an intensity of 9 W having a 5 $\mu$m beam diameter irradiates for 0.1 second the amorphous silicon layer 3, through the window 7, and the PSG film 6 surrounding the window 7 (FIGS. 3D, 4A).

Figure 4B:
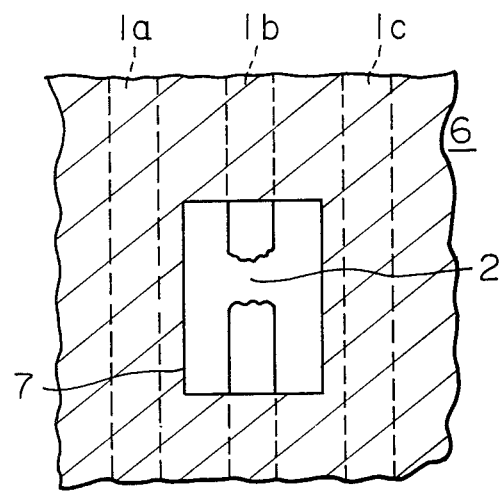
FIG. 4B is a plan view of a cut layer of FIG. 4A.

The amorphous silicon layer 3 and the underlying section of the aluminum layer 1b melt. The aluminum layer 1b is then separated at the portion 2 due to the surface tension of the molten aluminum (FIG. 4B). On the other hand, the other aluminum layers 1a and 1c are not affected by the irradiation of the laser beam (FIG. 4B).

In the above-mentioned embodiment, the amorphous silicon layer 3 is deposited on the aluminum layer 1b, whereas the protective PSG film 6 is deposited on the other aluminum layers 1a and 1c (FIG. 3C). In the case where the protective film is silicon oxynitride (SiON) or polyimide, which can be deposited at a relatively low temperature at which aluminum and amorphous silicon do not alloy with each other, such protective films may be deposited after the amorphous silicon layer is deposited on the aluminum layer.

If refractory metals, such as molybdenum, tungsten, and platinum are used as electrical conductive layers, polysilicon, which has a higher melting point, may be deposited instead of amorphous silicon.

The present invention enables easy, selective cutting of the electrical conductive layer exactly at the intended portion without damaging other portions, thereby increasing the yield of the products, such as semiconductor devices, and improving the reliability thereof.

I claim:

1. A process for selectively cutting an electrical conductive layer by irradiation with an energy beam, comprising the steps of:
   (a) depositing a film of a heat-absorbing material on a portion of the electrical conductive layer to be cut; and
   (b) irradiating the heat absorbing film with the energy beam, thereby melting and alloying the heat absorbing material with the portion of the electrical conductive layer using the energy of the energy beam that is absorbed and transferred by the heat-absorbing film.

2. A process according to claim 1, wherein said step (b) comprises irradiating the heat absorbing film using a laser beam as the energy beam.

3. A process according to claim 1, wherein said step (a) comprises depositing amorphous silicon as the heat-absorbing material on an aluminum electrical conductive layer.

4. A process according to claim 2, wherein said step (a) comprises depositing amorphous silicon as the heat-absorbing material on an aluminum electrical conductive layer.

5. A process according to claim 1, wherein said step (a) comprises depositing material selected from the group consisting of amorphous silicon and polysilicon as the heat-absorbing material on a refractory metal electrical conductive layer.

6. A process according to claim 2, wherein said step (a) comprises depositing material selected from the group consisting of amorphous silicon and polysilicon as the heat-absorbing material on a refractory metal electrical conductive layer.

7. A process for selectively cutting electrical conductive layers, comprising the steps of:
   (a) forming a protective film over the electrical conductive layers;
   (b) etching the protective film over a portion of one of the electrical conductive layers to form a window and expose the electrical conductive layer;
   (c) forming a film of a heat-absorbing material on the exposed portion of the electrically conductive layer; and
   (d) irradiating the heat-absoring material to melt the heat-absorbing film and the electrical conductive layer, thereby cutting the electrical conductive layer.

8. A process according to claim 7, wherein said step (d) comprises irradiating the heat-absorbing material for approximately 0.1 seconds.

9. A process according to claim 8, wherein said step (d) comprises irradiating the heat-absorbing material with an energy beam having an intensity of substantially 9 W and a beam diameter of substantially 5 $\mu$m.

* * * * *

UNITED STATES PATENT AND TRADEMARK OFFICE
CERTIFICATE OF CORRECTION

PATENT NO. : 4,476,375

DATED : October 9, 1984

INVENTOR(S) : Tsutomu Ogawa et al

It is certified that error appears in the above-identified patent and that said Letters Patent is hereby corrected as shown below:

Column 1, line 55, after "melted" insert -- and --.

Signed and Sealed this

Fourth Day of June 1985

[SEAL]

Attest:

DONALD J. QUIGG

Attesting Officer

Acting Commissioner of Patents and Trademarks